United States Patent [19]

Fujishima

[11] 4,232,394
[45] Nov. 4, 1980

[54] STATION-SIGNAL FREQUENCY INDICATION SYSTEM FOR RADIO RECEIVER

[75] Inventor: Masakazu Fujishima, Hamamatsu, Japan

[73] Assignee: Nippon Gakki Seizo Kabushiki Kaisha, Hamamatsu, Japan

[21] Appl. No.: 49,788

[22] Filed: Jun. 18, 1979

[30] Foreign Application Priority Data

Jun. 22, 1978 [JP] Japan ................................ 53-75636

[51] Int. Cl.³ ........................ H04B 1/16; G01R 21/10
[52] U.S. Cl. ...................................... 455/158; 334/86; 358/192.1
[58] Field of Search ........................ 325/455; 358/192; 331/64; 334/86; 324/78 D, 79 D

[56] References Cited

U.S. PATENT DOCUMENTS

| 3,509,484 | 4/1970 | Basse | 325/455 |
| 3,753,119 | 8/1973 | Close | 325/455 |
| 3,758,853 | 9/1973 | Dionne et al. | 325/455 |
| 3,835,424 | 9/1974 | Marik | 325/455 |
| 3,983,491 | 9/1976 | Yoshisato | 325/455 |
| 3,991,382 | 11/1976 | Iida et al. | 325/455 |
| 4,024,477 | 5/1977 | Yamaguchi et al. | 325/455 |
| 4,065,727 | 12/1977 | Johnson, Sr. | 331/64 |

Primary Examiner—Marc E. Bookbinder
Attorney, Agent, or Firm—Cushman, Darby & Cushman

[57] ABSTRACT

A station-signal frequency indicating system for a radio receiver, in which the content in a counter counting an output of a local oscillator in the receiver is temporarily retained by a latching circuit and in turn is displayed by an indicator, and in which a control circuit inhibits the retained content in the latching circuit from being changed, immediately after the receiver is tuned exactly to a station signal until the receiver is detuned from this station signal.

10 Claims, 9 Drawing Figures

STATION-SIGNAL FREQUENCY INDICATION SYSTEM FOR RADIO RECEIVER

BACKGROUND OF THE INVENTION (a) Field of the Invention

The present invention is related to a station-signal frequency indicating system for a radio receiver.

(b) Description of the Prior Art

Some modern radio receivers incorporate a station-signal frequency indicating system which electrically detects and displays the frequency of a station signal received.

Such known station-signal frequency indicating system usually has been designed so that a signal generated at a local oscillator in the receiver is repetitively counted by a counter to detect the local oscillation frequency. The counter is preset at a fixed numerical value corresponding to the intermediate frequency employed in the receiver. The count in the counter at the end of each counting period is displayed on a digital indicator as an indication of the station-signal frequency received. In practice, a correct indication is observed on the indicator, provided that the receiver is tuned exactly to the frequency of the station signal. However, in case the receiver is not exactly tuned to a station signal, the above system is no longer capable of indicating the exact station-signal frequency, and the system displays the tuning frequency itself of the receiver despite the fact that the receiver continuously receives the same station signal of a frequency slightly different from the tuning frequency. This is because the prior art system is essentially designed to always display an indication corresponding to the local oscillating frequency plus or minus the fixed preset number (numerical value) (intermediate frequency), irrespective of whether or not the receiver is exactly tuned-in for a given station signal. With the prior art system, furthermore, there has often arisen the problem that, because of the continuous running of the counter, noise signals that might be produced by the running counter would affect the receiver circuitry, interfering with the normal operation of the receiver.

SUMMARY OF THE INVENTION

It is, therefore, an object of the present invention to provide an improved station-signal frequency indicating system for a radio receiver, which is capable of indicating the exact frequency of a station signal received even when the receiver is not precisely tuned to the station signal.

According to the present invention, a station-signal frequency indicating system for a radio receiver comprises: a counter circuit associated with said radio receiver for repetitively counting a signal having a frequency related to a tuning frequency of the radio receiver to represent the tuning frequency by a count obtained in the counter circuit at the end of each counting period of time during which a period-counting is carried out by the counter circuit; a latching circuit for receiving and temporarily retaining a count obtained in the counter circuit at the end of the respective counting period of time; an indicator means for displaying a count retained in the latching circuit; and a control circuit associated with the radio receiver for inhibiting the latching circuit from renewing its retaining count at the instant that the radio receiver becomes tuned exactly to a given station signal, and thereafter for causing the latching circuit to keep its retaining count unchanged until the radio receiver becomes substantially detuned from the frequency of the given station signal, whereby the frequency of the given station signal is displayed by the indicator means so long as this station signal is being received by the radio receiver.

Another object of the present invention is to provide such station-signal frequency indicating system as described above, wherein the counter circuit is disabled of counting by the control circuit while the radio receiver is substantially in the tuned condition, whereby the receiver is free of interfering therewith by noise signals that might be produced by the running counter circuit.

These and other objects as well as the features and the advantages of the present invention will become apparent from the following detailed description of the preferred embodiments of the present invention when taken in conjunction with the accompanying drawings.

BRIEF DESCRIPTION OF THE DRAWINGS

In FIGS. 1 and 2, like parts are indicated by like reference numerals.

DETAILED DESCRIPTION OF THE PREFERRED EMBODIMENTS

Figure 1:
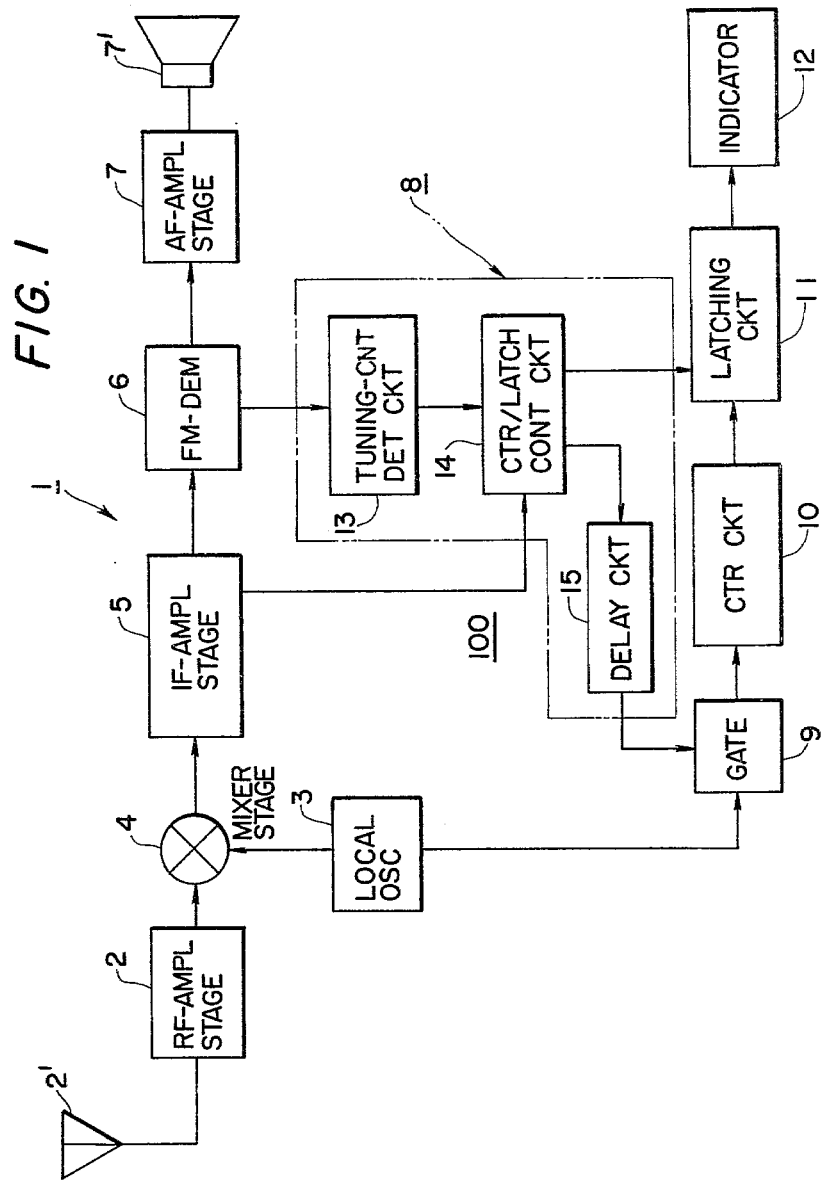
FIG. 1 is a block diagram of an embodiment of a station-signal frequency indicating system according to the present invention, which is intended to be incorporated in a superheterodyne FM radio receiver.

An embodiment of a station-signal frequency indicating system according to present invention is shown in block diagram in FIG. 1, which is incorporated in an FM radio receiver.

This superheterodyne FM radio receiver comprises a receiver circuitry, generally indicated at 1, and consists of the following well-known constituting parts: an RF(Radio Frequency)-amplifier stage 2, a local oscillator 3, a mixer or converter stage 4, an IF(Intermediate Frequency)-amplifier stage 5, an FM-demodulator 6, an AF(Audio Frequency)-amplifier stage 7, a loud-speaker 7', and a station-signal receiving antenna 2'. The functions of the respective parts and the overall operation of the receiver circuitry 1 are known by those skilled in the electronics field, so that their detailed description is omitted here.

The station-signal frequency indicating system, which is indicated generally at 100, comprises a counter circuit 10, a gate 9, a latching circuit 11, an indicator 12, and a control circuit 8 consisting of a tuning-center detector circuit 13, a counter/latch control circuit 14, and a delay circuit 15. The output signal of the local oscillator 3 is supplied through the gate 9 to the counter circuit 10 whereat it is repetitively counted for each counting period of time for the counter circuit 10. A count obtained in the counter circuit 10 at the end of each counting period of time is received and is temporarily retained by the latching circuit 11, whose content, i.e. a retained count, is displayed by the indicator 12. The indicator 12, preferably, is a numerical read-out display such as an array of light-emitting diodes, a planar gas-discharge display, an NIXIE-tube display, and so on, which provides for digital indication. The counter circuit 10 is provided for the purpose of detecting a tuning frequency of the receiver by counting the local oscillator output signal whose frequency is linearly related to, but has a constant difference from, the tuning frequency of the receiver. To compensate for this frequency difference, a fixed number (numerical value) is preset for the counter circuit 10. If the receiver is designed so that the local oscillator 3 oscillates at a frequency lower than the tuning frequency by the intermediate frequency to which the IF-amplifier stage 5 is tuned, the preset number (numerical value) corresponding to the intermediate frequency is preset in the counter 10 to be always added to the count value. The control circuit 8 operates in association with the receiver circuitry 1 to perform the control of the latching circuit 11 and the counter circuit 10. More particularly, the tuning-center detector circuit 13 detects the exact tuning-in of the receiver for a given station signal, on the basis of the output signal of the FM demodulator 6, to deliver a detecting signal. Upon generation of a detecting signal, the counter/latch control circuit 14 will immediately set a control signal for being supplied to the latching circuit 11, so as to inhibit the latching circuit 11 from renewing its retained count. Almost simultaneously therewith, the control signal is applied through the delay circuit 15 to the gate for disabling same, so that the counter 10 is prohibited from counting. Thereafter, if the receiver is caused to be detuned from the frequency of the station signal, and accordingly if the carrier signal level in the IF-amplifier stage 5 is reduced below a reference level, the counter/latch control circuit 14 will detect such reduction of the carrier signal level, so that the control signal from the circuit 14 is reset, thereby enabling again the gate 9 and releasing the prohibition on the latching circuit 11.

The operation of the aforementioned station-signal frequency indicating system of the present invention will hereunder be explained in further detail.

Firstly, let us suppose that the receiver is completely detuned from any station signal. In such case, the gate 9 is enabled so that the output signal of the local oscillator 3 is constantly fed to the counter circuit 10 through the enabled gate 9. By repetitively counting the inputted signal for each counting period of time, the counter circuit 10 will obtain, at the end of the counting period of time, a count which represents the tuning frequency of the receiver. Also in this case, the latching circuit 11 is able to renew its content because of the control signal from the circuit 14 having been reset. Therefore, the count in the counter circuit 10 is received and is retained by the latching circuit 11, and is displayed on the indicator 12. Namely, the tuning frequency of the receiver is displayed on the indicator 12.

Conversely, in case the receiver catches a given station signal and then same is tuned exactly to the station signal, the counter/latch control circuit 14 will, upon reception of the detecting signal from the tuning center detector circuit 13, operate to set a control signal so that the counter and latching circuits 10 and 11 are inhibited from counting and renewing, respectively. The content in the latching circuit 11 at such time is indicative of the frequency of the station signal frequency to which the receiver is exactly tuned and displayed on the indicator 12. This indication on the indicator remains unchanged so long as the receiver is being tuned, if not exactly, to the frequency of the station signal.

Then, if the receiver is detuned from the station signal, this fact is detected by the counter/latch circuit 14 by detecting a reduction in the carrier signal level in the IF-amplifier stage, and the control signal from the circuit 14 is reset, so that the inhibition to the gate 9 (or the counter 10) and the latching circuit 11 is released. Hence, the count in the counter and the count in the latching circuit can vary so as to follow the tuning frequency of the receiver, and thus the tuning frequency of the receiver is displayed on the indicator 12.

As such, the station-frequency indicating system of the present invention is capable of indicating the frequency of a station-signal frequency received so long as the receiver is being tuned, if not exactly, to the frequency of the station signal. Moreover, in this embodiment, counting by the counter circuit 10 is stopped when the receiver is tuned-in for a given station signal, so that noise problem due to continuous running of the counter circuit which would occur in the prior art is obviated, and that a stable performance of the receiver is insured.

Figure 2:
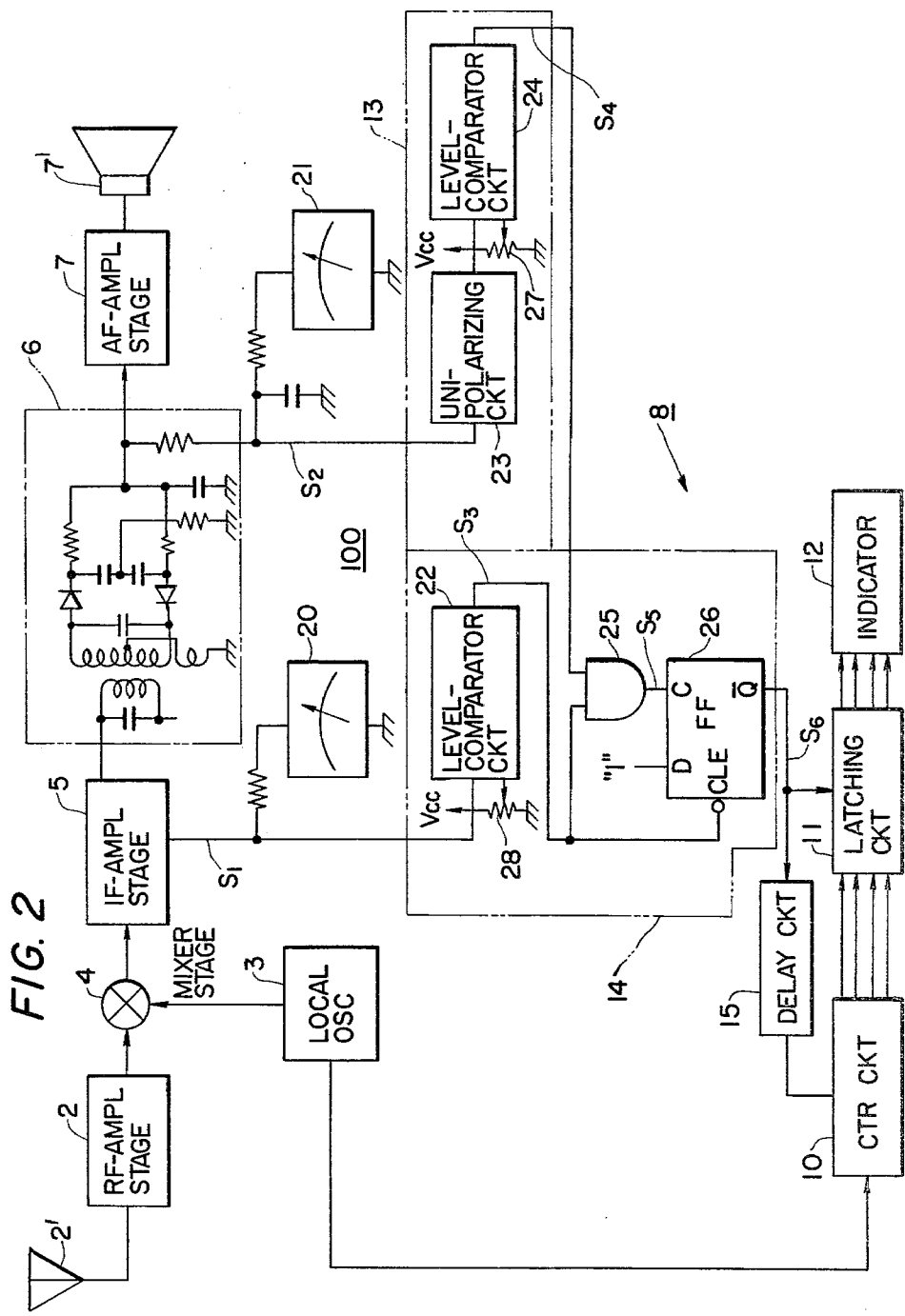
FIG. 2 is a detailed block diagram of such station-signal frequency indicating system as shown in FIG. 1, which represents a partial modification of the counter circuit employed in the system.

A more concrete embodiment of a station-signal frequency indicating system according to the present invention is shown in FIG. 2, which is substantially of the same arrangement as that of the preceding embodiment, but has a minor modification.

In FIG. 2, the FM demodulator 6 is shown in the form of a well-known ratio detector, and its output signal S2 is supplied to a tuning-indicator meter 21 as well as to the tuning-center detector circuit 13. The tuning-indicator meter 21 is such that it indicates a null point, or a center point, of the scale when the receiver is tuned exactly to the frequency of a given station signal or completely detuned therefrom. The tuning-center detector circuit 13 is comprised of a unipolarizing circuit or absolute-value circuit 23 for obtaining a unipolar signal equal in magnitude to the output of the FM demodulator 6, and a level comparator circuit 24 for performing a level comparison of the output signal of the preceding circuit 23 with a reference potential calibrated through a potentiometer 27. The unipolarizing circuit 23 may be a full-wave rectifier circuit. The counter/latch control circuit 14 is comprised of another level comparator circuit 22, an AND gate 25, and a flip-flop circuit 26. The comparator circuit 22 is provided for detecting, on the basis of the carrier signal level at the IF-amplifier stage 5, the fact that the receiver is substantially detuned from the frequency of any given station signal. In the instant embodiment, the IF-amplifier stage 5 is designed so that a dc signal $S_1$ having a level corresponding to the carrier signal level is produced in the IF-amplifier stage 5 to drive an indicator meter 20 on which a peak deflection is observed when the receiver is tuned to a station signal. Accordingly, the level comparator circuit 22 is arranged so that it performs a level comparison between the dc signal $S_1$ and a reference potential given through a potentiometer 28. Needless to say, the counter/latch control circuit 14 may include some circuit means such as a rectifier circuit for producing a signal equivalent to the signal $S_1$ from the carrier signal taken at the IF-amplifier stage 5 and then for delivering such a signal to the meter 20 and to the comparator 22. An output signal $S_3$ of the level comparator circuit 22 is applied to the clear input CLE of the flip-flop circuit 26 and also to an input of the AND gate 25, another input of which is applied with an output signal $S_4$ of the level comparator circuit 24. An output signal $S_5$ of the AND gate 25 is supplied to a clock input C of the flip-flop circuit 26. A date input D of the flip-flop circuit 26 is held at a logical "1" level of potential. A $\overline{Q}$ output signal $S_6$ of the flip-flop circuit 26, serving as the control signal, is supplied directly to the latching circuit 11, and also through the delay circuit 15, with a time delay, to the counter circuit 10. In the instant embodiment, a gate corresponding to such gate as shown at 9 in FIG. 1 is not shown, because it is built in the counter circuit 10.

The operation of the instant embodiment will be explained below, by referring to FIGS. 3A to 3G wherein signals $S_1$ to $S_6$ are illustrated to show variation as the tuning frequency of the receiver is varied.

Figure 3A:
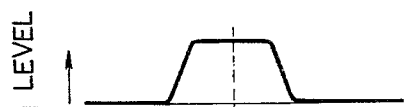
FIGS. 3A to 3G are graphs of signal waveforms useful in explaining the operation of the station-signal frequency indicating system shown in FIG. 2.
Figure 3B:
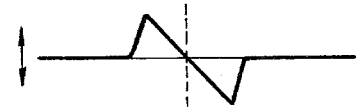
Figure 3C:
Figure 3D:
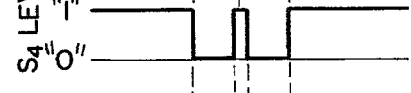
Figure 3E:
Figure 3F:

In case the receiver is completely detuned toward the lower frequency side from a given station signal of a frequency F, the signals $S_1$ and $S_2$ are both at null level as seen in FIGS. 3A and 3B, so that the signal $S_3$ is reset and it assumes a logical "0" level of potential as shown in FIG. 3C. Hence, the flip-flop circuit 26 is kept cleared, so that the control signal $S_6$ is reset and it assumes a logical "1" level of potential as seen in FIG. 3F. Therefore, the counter circuit 10 is now enabled for counting its input signal, and also the latching circuit 11 is now able to renew its content in accordance with the count in the counter circuit 10. Thus, the tuning frequency of the receiver per se is displayed on the indicator 12.

In case the tuning frequency of the receiver is then varied toward the aimed station-signal frequency F, the levels of the signals $S_1$ and $S_2$ will change as shown in FIGS. 3A and 3B, and therefore the respective signals $S_3$ to $S_6$ will assume such corresponding levels of potential as shown in FIGS. 3C to 3F. Thereafter, at the moment that the receiver is tuned exactly to the station-signal frequency F, the signal $S_4$ is set, and both signals $S_3$ and $S_4$ will assume a logical "1" level of potential. Thus, the signal $S_5$ assumes a logical "1" level of potential, so that the signal $S_6$ is set so as to assume a logical "0" level of potential. As a result, the latching circuit 11 is inhibited from renewing its content, and also the counter circuit 10 is disabled of counting. Since the content retained in the latching 11, at such time, is indicative of the tuning frequency when the receiver is in exactly tuned condition, i.e. of the received station frequency F, this station frequency F is displayed on the indicator 12.

Thereafter, if the tuning frequency of the receiver is increased, the respective signals $S_1$ to $S_5$ will change in level of potential as shown in FIGS. 3A to 3E. So long as, however, the frequency deviation of the tuning frequency from the station frequency-signal F is less than $\Delta F$ (see FIGS. 3A to 3F), the signal $S_6$ will remain at the logical "0" level of potential as seen in FIG. 3F, so that the retained count in the latching circuit 11 is still held unchanged. Accordingly, the station-signal frequency F is constantly displayed on the indicator 12, independently of the changed tuning frequency of the receiver.

But, if the tuning frequency of the receiver is increased beyond a higher limit, $F + \Delta F$, i.e. if the receiver becomes completely detuned toward the higher frequency side from the station-signal frequency F, the signal $S_3$ will be reset to assume again the logical "0" level of potential, clearing the flip-flop circuit 26. Accordingly, the control signal $S_6$ is reset, so that the inhibition to both the counter circuit 10 and the latching circuit 11 will be released again. Thus, the counter circuit 10 will restart counting, and the content in the latching circuit 11 is allowed to be renewed in accordance with the count in the counter circuit 10. In this way, the tuning frequency of the receiver, in place of the station frequency, is displayed on the indicator 12.

Figure 3G:
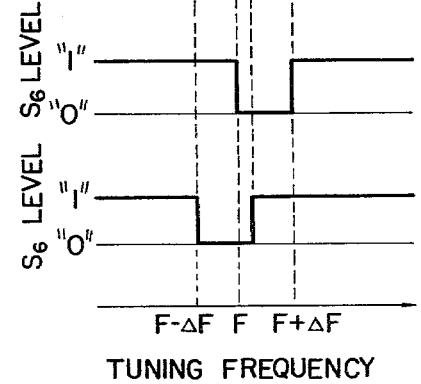

Conversely, in case the tuning frequency of the receiver is varied down toward the station frequency F beyond the higher limit, $F + \Delta F$, the level of the control signal $S_6$ will change as shown in FIG. 3G. At the moment that the receiver becomes tuned exactly to the station-signal frequency F, the signal $S_6$ will assume a logical "0" level of potential, so that the counter circuit 10 and the latching circuit 11 are both inhibited. Then, the station-signal frequency F is displayed by the indicator 12. Thereafter, in case the tuning frequency is further lowered and becomes lower than the lower limit, $F - \Delta F$, i.e. in case the receiver is completely detuned, the signal $S_6$ is reset to assume a logical "1" level of potential, with the result that the inhibition to the counter circuit 10 and the latching circuit 11 is released again. Accordingly, the tuning frequency per se is displayed on the indicator 12. It should be noticed in FIG. 3G that so long as the tuning frequency is contained within a frequency range from F down to $F - \Delta F$, the station frequency F is constantly displayed.

Although the present invention has been described as being embodied in conjunction with an FM radio receiver, it should be noticed that the present invention can easily be applied also to an AM radio receiver with, if necessary, some minor modifications.

What is claimed is:

1. A station-signal frequency indicating system for a radio receiver, comprising:
 a counter circuit associated with said radio receiver for repetitively counting during a sequence of one or more counting periods a signal having a frequency related to a tuning frequency of said radio receiver to represent the tuning frequency of said radio receiver by a count obtained in said counter circuit at the end of each counting period for which counting is carried out by said counter circuit;
 a latching circuit for receiving and temporarily retaining the count obtained in said counter circuit at the end of said each counting period;
 an indicator means for displaying the count retained in said latching circuit; and
 a control circuit coupled to said radio receiver for stopping said latching circuit from renewing its retaining count at the moment that said radio receiver becomes tuned exactly to a given station signal, and thereafter causing said latching circuit to keep its retaining count unchanged until said radio receiver becomes substantially detuned from said given station signal, whereby the frequency of said given station signal is displayed by said indicator means so long as this station signal is being received by said radio receiver.

2. A station-signal frequency indicating system according to claim 1, in which: said control circuit inhibits said counter circuit from counting during the period in which said latching circuit is being prohibited from renewing a count therein by said control circuit.

3. A station-signal frequency indicating system according to claim 1, in which: said counter circuit counts an output signal of a local oscillator included in said radio receiver and is preset with a fixed number (numerical value) related to an intermediate frequency to which is tuned an intermediate-frequency amplifier stage included in said radio receiver.

4. A station-signal frequency indicating system according to claim 1, in which: said control circuit comprises:
- a first circuit means associated with said radio receiver for detecting that said radio receiver is tuned exactly to a station signal to thereby deliver a first detecting signal;
- a second circuit means associated with said radio receiver for detecting that said radio receiver is substantially detuned from a station signal to thereby deliver a second detecting signal; and
- a third circuit means associated with said first and second circuit means for setting a control signal to inhibit said latching circuit from renewing its retaining count when said third circuit means receives said first detecting signal delivered from said first circuit means and for resetting said control signal to release said inhibition to said latching circuit when said third circuit means receives said second detecting signal delivered from said second circuit means.

5. A station-signal frequency indicating system according to claim 1, in which: said radio receiver is an FM radio receiver including an FM demodulator and an intermediate-frequency amplifier stage, and in which: said control circuit comprises:
- a first circuit means associated with said FM demodulator for performing level comparison between a first reference potential and an output of said FM demodulator and for setting a first detecting signal when an absolute level of said FM-demodulator output signal is less than the level of said first reference potential;
- a second circuit means associated with said intermediate-frequency amplifier stage for performing level comparison between a second reference potential and a carrier signal in said intermediate-frequency amplifier stage and for setting a second detecting signal when the level of said carrier signal is more than the level of said second reference potential; and
- a third circuit means associated with said first and second circuit means for setting a control signal to inhibit said latching circuit from renewing its retaining count when both said first and second detecting signals are set and thereafter for keeping said control signal set until said second detecting signal is reset.

6. A station-signal frequency indicating system according to claim 5, in which: said third circuit means comprises:
- an AND gate receiving, as its input signals, said first and second detecting signals and setting an output signal thereof when said first and second detecting signals are both set; and
- a flip-flop circuit caused to assume a first state thereof by a setting of said output signal of said AND gate and caused to assume a second state by a resetting of said second detecting signal, said control signal being produced from said flip-flop circuit.

7. A station-signal frequency indicating system according to claim 5, in which: said first circuit means comprises:
- a unipolarizing circuit for obtaining a unipolar signal with a level corresponding to an absolute level of said output signal of said FM demodulator; and
- a level comparator circuit for performing level comparison between said unipolar signal and said first reference potential to deliver said first detecting signal.

8. A station-signal frequency indicating system according to claim 5, in which: said second circuit means comprises a level comparator circuit for performing level comparison between said second reference potential and a dc-signal having a level corresponding to said carrier signal to deliver said second detecting signal.

9. A station-signal frequency indicating system according to claim 6, in which: said third circuit means further comprises a delay circuit for supplying therethrough, with a time delay, said control signal to said counter circuit, said counter circuit being inhibited from counting while said control signal supplied through said delay circuit is being set.

10. A station-signal frequency indicating system according to claim 6, further comprising:
- a gate for supplying therethrough the input signals to said counter circuit, and in which:
- said third circuit means further comprises a delay circuit for supplying therethrough, with a time delay, said control signal to said gate, said gate being disabled to inhibit said counter from counting while said control signal supplied to said gate is being set.

* * * * *